(12) United States Patent
Yang et al.

(10) Patent No.: US 10,559,624 B2
(45) Date of Patent: Feb. 11, 2020

(54) SELECTOR DEVICE HAVING ASYMMETRIC CONDUCTANCE FOR MEMORY APPLICATIONS

(71) Applicant: Avalanche Technology, Inc., Fremont, CA (US)

(72) Inventors: Hongxin Yang, Newark, CA (US); Xiaojie Hao, Fremont, CA (US); Jing Zhang, Los Altos, CA (US); Xiaobin Wang, Fremont, CA (US); Bing K. Yen, Cupertino, CA (US)

(73) Assignee: Avalanche Technology, Inc., Fremont, CA (US)

( * ) Notice: Subject to any disclaimer, the term of this patent is extended or adjusted under 35 U.S.C. 154(b) by 198 days.

(21) Appl. No.: 15/438,631

(22) Filed: Feb. 21, 2017

(65) Prior Publication Data
US 2018/0240844 A1    Aug. 23, 2018

(51) Int. Cl.
H01L 27/22    (2006.01)
H01L 43/08    (2006.01)

(52) U.S. Cl.
CPC ............ H01L 27/224 (2013.01); H01L 43/08 (2013.01)

(58) Field of Classification Search
CPC ....... H01L 27/224; H01L 43/08; H01L 43/10; H01L 43/02; H01L 45/085; G11C 11/161; G11C 11/1659; G11C 11/1673; G11C 11/1675; G11C 16/10
USPC ........................................................ 257/421
See application file for complete search history.

(56) References Cited

U.S. PATENT DOCUMENTS

| 6,944,052 | B2* | 9/2005 | Subramanian | G11C 11/16 257/E27.004 |
| 2005/0002228 | A1* | 1/2005 | Dieny | B82Y 25/00 365/171 |
| 2012/0155159 | A1* | 6/2012 | Prejbeanu | G11C 11/16 365/158 |
| 2013/0162333 | A1* | 6/2013 | Colli | H01L 31/02240 327/535 |
| 2014/0209892 | A1 | 7/2014 | Kuo et al. | |
| 2014/0264224 | A1 | 9/2014 | Zhang et al. | |
| 2014/0319634 | A1* | 10/2014 | Shukh | H01L 27/224 257/427 |
| 2015/0325783 | A1* | 11/2015 | Wang | H01F 10/3286 257/421 |
| 2015/0372055 | A1* | 12/2015 | Chen | H01L 27/224 257/421 |

(Continued)

*Primary Examiner* — Duy T Nguyen
(74) *Attorney, Agent, or Firm* — Bing K. Yen

(57) ABSTRACT

The present invention is directed to a memory cell that includes a magnetic tunnel junction (MTJ) memory element, which has a low resistance state and a high resistance state, and a two-terminal selector coupled to the MTJ memory element in series. The MTJ memory element includes a magnetic free layer and a magnetic reference layer with an insulating tunnel junction layer interposed therebetween. The two-terminal selector has an insulative state and a conductive state. The two-terminal selector in the conductive state has substantially lower resistance when switching the MTJ memory element from the low to high resistance state than from the high to low resistance state. The voltages applied to the memory cell to respectively switch the MTJ memory element from the low to high resistance state and from the high to low resistance state may be substantially same.

21 Claims, 12 Drawing Sheets

(56) References Cited

U.S. PATENT DOCUMENTS

2016/0020250 A1 1/2016 Li et al.
2017/0110650 A1* 4/2017 Park ........................ H01L 43/02
2017/0259267 A1* 9/2017 Kim .................. B01L 3/502784

* cited by examiner

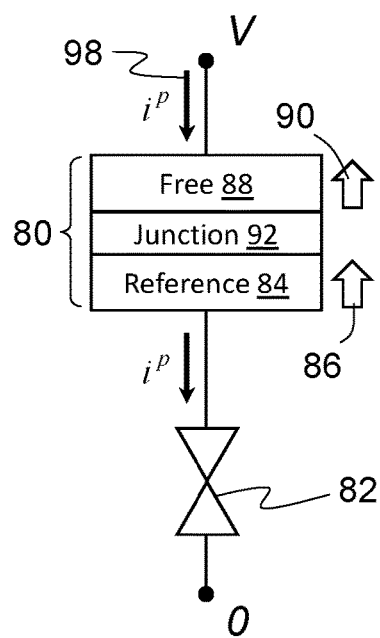
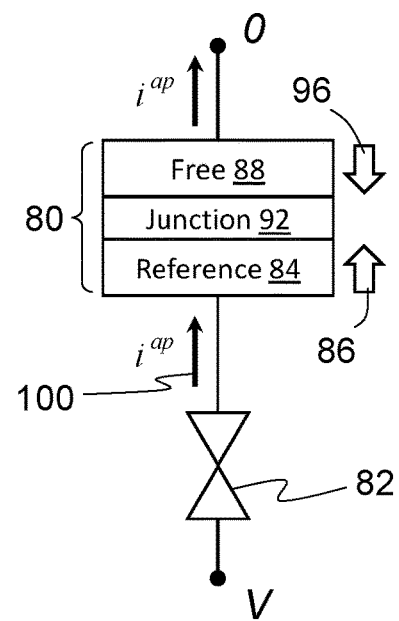
FIG. 3A PRIOR ART
FIG. 3B PRIOR ART

SELECTOR DEVICE HAVING ASYMMETRIC CONDUCTANCE FOR MEMORY APPLICATIONS

BACKGROUND

The present invention relates to a memory cell for data storage applications, and more particularly, to embodiments of a memory cell including a magnetic tunnel junction (MTJ) memory element coupled to a selector device that exhibits asymmetric conductance.

Spin transfer torque magnetic random access memory (STT-MRAM) is a new class of non-volatile memory, which can retain the stored information when powered off. An STT-MRAM device normally comprises an array of memory cells, each of which may include a magnetic memory element and a selection element coupled in series between appropriate electrodes. The selector element may be a three terminal device, such as transistor, or a two-terminal device, such as diode or Ovonic threshold switch (OTS). Upon application of a switching current through the magnetic memory element, the electrical resistance of the magnetic memory element would change accordingly, thereby switching the stored logic in the respective memory cell.

FIG. 1 is a schematic circuit diagram of a memory array 30, which comprises a plurality of memory cells 32 with each of the memory cells 32 including a two-terminal selector 34 coupled to a magnetic memory element 36 in series; a first plurality of parallel wiring lines 38A-C with each being coupled to a respective row of the magnetic memory elements 36 in a first direction; and a second plurality of parallel wiring lines 40A-C with each being coupled to a respective row of the selectors 34 in a second direction substantially perpendicular to the first direction. Accordingly, the memory cells 32 are located at the cross points between the first and second plurality of wiring lines 38A-C and 40A-C. The first and second plurality of wiring lines 38A-C and 40A-C may be word lines and bit lines, respectively, or vice versa. Multiple layers of the memory array 30 may be stacked to form a monolithic three-dimensional memory device.

FIG. 2 illustrates a scheme for programming a memory cell 32BB in the memory array 30 of FIG. 1. The memory cell 32BB to be programmed is selected by applying a programming voltage, V, to one of the second wiring lines 40B coupled thereto, while grounding one of the first wiring lines 38B connected to the memory cell 32BB, thereby generating a potential difference of V across the memory cell 32BB for programming. Meanwhile, to minimize current leakage and prevent accidental programming of the unselected memory cells, a voltage of about V/2 is applied to the unselected second wiring lines 40A, 40C-D, and the unselected first wiring lines 38A, 38C, resulting in a potential difference of V/2 across the unselected memory cells 32BA, 32AB, 32CB, 32DB, 32BC that are coupled to either the selected first wiring line 38B or the selected second wiring line 40B. The voltage value V/2 is less than the threshold voltage, $V_{th}$, for the selector to become conductive, thereby preventing unintended programming of the unselected memory cells 32BA, 32BC connected to the selected second wiring line 40B. The rest of the unselected memory cells 32AA, 32CA, 32DA, 32AC, 32CC, and 32DC that are not connected to the selected first wiring line 38B or the selected second wiring line 40B experience essentially no potential drop thereacross, thereby minimizing current leakage.

Referring back to FIG. 1, the magnetic memory element 36 normally includes a magnetic reference layer and a magnetic free layer with an electron tunnel junction layer interposed therebetween. The magnetic reference layer, the electron tunnel junction layer, and the magnetic free layer collectively form a magnetic tunnel junction (MTJ). Upon the application of an appropriate current through the MTJ, the magnetization direction of the magnetic free layer can be switched between two directions: parallel and anti-parallel with respect to the magnetization direction of the magnetic reference layer. The electron tunnel junction layer is normally made of an insulating material with a thickness ranging from a few to a few tens of angstroms. When the magnetization directions of the magnetic free and reference layers are substantially parallel or oriented in a same direction, electrons polarized by the magnetic reference layer can tunnel through the insulating tunnel junction layer, thereby decreasing the electrical resistance of the MTJ. Conversely, the electrical resistance of the MTJ is high when the magnetization directions of the magnetic reference and free layers are substantially anti-parallel or oriented in opposite directions. The stored logic in the magnetic memory element can be switched by changing the magnetization direction of the magnetic free layer between parallel and anti-parallel with respect to the magnetization direction of the reference layer. Therefore, the MTJ has two stable resistance states that allow the MTJ to serve as a non-volatile memory element.

Based on the relative orientation between the magnetic reference and free layers and the magnetization directions thereof, an MTJ can be classified into one of two types: in-plane MTJ, the magnetization directions of which lie substantially within planes parallel to the same layers, or perpendicular MTJ, the magnetization directions of which are substantially perpendicular to the layer planes.

FIGS. 3A and 3B illustrate the programming operations of an STT-MRAM cell including a perpendicular MTJ memory element 80 coupled to a two-terminal selector 82 in series. The MTJ memory element 80 includes a magnetic reference layer 84 having an invariable or fixed magnetization direction 86 perpendicular to the layer plane thereof, a magnetic free layer 88 having a variable magnetization direction 90 or 96 perpendicular to the layer plane thereof, and a tunnel junction layer 92 interposed therebetween.

FIG. 3A illustrates the writing or programming process for switching the resistance state of the MTJ memory element 80 from high to low. As electrons that pass through the magnetic reference layer 84 are being spin-polarized, the spin-polarized electrons exert a spin transfer torque on the magnetic free layer 88. When the spin-polarized current or parallelizing current ($i^P$) 98 exceeds a threshold level, the magnetic free layer 88 switches from the anti-parallel to parallel magnetization direction 90 with respect to the fixed magnetization direction 86 of the magnetic reference layer 84. It should be noted that the parallelizing write current ($i^P$) 98 flows in the opposite direction as the electrons.

Conversely, FIG. 3B illustrates the writing process for switching the resistance state of the MTJ memory element 80 from low to high. As electrons pass through the magnetic free layer 88, the electrons with the same spin direction as that of the magnetization in the magnetic reference layer 84 pass into the magnetic reference layer 84 unimpeded. However, the electrons with the opposite spin direction are reflected back to the magnetic free layer 88 at the boundary between the tunnel junction layer 92 and the magnetic reference layer 84, causing the magnetization direction 96 of the magnetic free layer 88 to switch from the parallel to anti-parallel orientation when the anti-parallelizing current ($i^{ap}$) 100 exceeds a threshold level.

FIG. 4 shows an exemplary current-voltage (I-V) response plot for a bi-directional two-terminal selector. The I-V response curve 110 shows the magnitude of electric current passing through the two-terminal selector element as the voltage applied thereto varies. Initially, the current slightly increases with the applied voltage from zero to near a threshold voltage, $V_{th}$. At or near $V_{th}$, the current rapidly increases and exhibits a highly non-linear exponential behavior, indicating a transition of the selector from a nominally insulative or "off" state to a nominally conductive or "on" state. As the selector voltage continues to increase beyond $V_{th}$, the current increase becomes gradual until reaching $V_P$, which may be the programming voltage required to drive a switching current through a magnetic memory element coupled to the selector. The current response behaves like a step function as the applied voltage increases from zero to $V_P$ with the sharp increase occurring at or near $V_{th}$, which may be about 60-80% of $V_P$. As previously shown in FIG. 2, during the programming operation, the unselected memory cells coupled to either the selected word line or the selected bit line are subjected to a net applied voltage equivalent to about half the programming voltage. Therefore, the leakage current, $I_{leak}$, for the selector in the "off" state is measured at the selector voltage of $V_P/2$. The ratio of $I_{on}$, which is the selector current at $V_P$, to $I_{leak}$ measured at $V_P/2$ is sometimes referred to as "on/off ratio."

With continuing reference to FIG. 4, as the selector voltage decreases from $V_P$ to near a holding voltage, $V_{hold}$, which is lower than $V_{th}$, the selector current gradually decreases and the selector remains in the highly conductive state. At or near $V_{hold}$, the current rapidly decreases and exhibits a highly non-linear behavior, indicating a transition from the nominally conductive state back to the nominally insulative state. As the voltage continues to decrease beyond $V_{hold}$, the current flow slightly decreases until stopping at about 0 V.

The I-V response curve 110 of the selector behaves like a hysteresis loop. The nominally insulating selector turns on or becomes conductive when the selector voltage exceeds $V_{th}$. Once in the conductive state, the selector will stay on or remain conductive until the selector voltage dropping below $V_{hold}$, which is less than $V_{th}$. In a conventional write or programming operation, the selector is first turned on by raising the selector voltage to about $V_{th}$. The selector voltage is then further increased to a higher level $V_P$ that is sufficient to drive a current $I_{on}$ for switching the resistance state of the magnetic memory element. In a conventional read or sensing operation, the selector is first turned on by raising the selector voltage to about $V_{th}$. The selector voltage is then decreased to a level between $V_{th}$ and $V_{hold}$ to minimize "read disturbance" while ensuring that the selector is sufficiently conductive to allow a sensing current to pass therethrough for determining the resistance state of the magnetic memory element.

The two-terminal selector characterized by the I-V response plot of FIG. 4 is bi-directional as the polarity of the selector voltage may be reversed from zero to $V'_P$ as shown. The I-V response curve 110' corresponding to the opposite polarity may be substantially similar to the curve 110 described above. The two response curves 110 and 110' for the selector are therefore substantially "symmetric" with respect to the current (vertical) axis at Selector Voltage=0.

A bi-directional selector may alternatively have an I-V response shown in FIG. 5. The I-V response plot of FIG. 5 differs from the I-V response plot of FIG. 4 in that after the selector is turned on at $V_{th}$, the current remains substantially constant with continuously increasing selector voltage or decreasing selector voltage until reaching $V_{hold}$, below which the selector is turned off. The constant current is sometimes referred to as "compliance current" ($I_{cc}$).

SUMMARY

The present invention is directed to a memory cell that includes a magnetic tunnel junction (MTJ) memory element, which has a low resistance state and a high resistance state, and a two-terminal selector coupled to the MTJ memory element in series. The MTJ memory element includes a magnetic free layer and a magnetic reference layer with an insulating tunnel junction layer interposed therebetween. The two-terminal selector has an insulative state and a conductive state. The two-terminal selector in the conductive state has substantially lower resistance when switching the MTJ memory element from the low to high resistance state than from the high to low resistance state. The voltages applied to the memory cell to respectively switch the MTJ memory element from the low to high resistance state and from the high to low resistance state may be substantially the same.

According to another aspect of the present invention, a memory cell comprises a magnetic free layer having a variable magnetization direction substantially perpendicular to a layer plane thereof; a magnetic reference layer having a first invariable magnetization direction substantially perpendicular to a layer plane thereof; an insulating tunnel junction layer interposed between the magnetic free layer and the magnetic reference layer; an anti-ferromagnetic coupling layer formed adjacent to the magnetic fixed layer opposite the insulating tunnel junction layer; a magnetic fixed layer formed adjacent to the anti-ferromagnetic coupling layer opposite the magnetic fixed layer and having a second invariable magnetization direction that is substantially perpendicular to a layer plane thereof and is opposite to the first invariable magnetization direction; and a selector structure that includes a first electrode and a second electrode with a switching layer interposed therebetween. The selector structure has substantially lower resistance when switching a relative orientation between the variable magnetization direction and the first invariable magnetization direction from parallel to anti-parallel than from anti-parallel to parallel.

BRIEF DESCRIPTION OF THE DRAWINGS

These and other features, aspects, and advantages of the present invention will become better understood with regard to the following description, appended claims, and accompanying drawings where:

FIGS. 3A and 3B illustrate schemes for programming a magnetic tunnel junction to low and high resistance states, respectively;

For purposes of clarity and brevity, like elements and components will bear the same designations and numbering throughout the Figures, which are not necessarily drawn to scale.

DETAILED DESCRIPTION

In the following description, directional terms, such as "front," "back," "top," "bottom," and the like, may be used with reference to the orientation of the illustrated figure. Spatially relative terms, such as "beneath," "below," "under," "lower," "upper," "above," etc., may be used herein to describe one element's relationship to another element(s) as illustrated in the figure. Since articles and elements can be positioned in a number of different orientations, these terms are intended for illustration purposes and in no way limit the invention.

Where reference is made herein to a material AB composed of element A and element B, the material AB can be an alloy, a compound, or a combination thereof, with the atomic concentration of A or B ranges from 1 to 99%, except where the context excludes that possibility. Similarly, a material ABC composed of elements A, B, and C may be an alloy, a compound, or a combination thereof, with the atomic concentration of each element in the range of 1 to 98%, except where the context excludes that possibility.

The term "noncrystalline" means an amorphous state or a state in which fine crystals are dispersed in an amorphous matrix, not a single crystal or polycrystalline state. In case of state in which fine crystals are dispersed in an amorphous matrix, those in which a crystalline peak is substantially not observed by, for example, X-ray diffraction can be designated as "noncrystalline."

The term "at least" followed by a number is used herein to denote the start of a range beginning with that number, which may be a range having an upper limit or no upper limit, depending on the variable being defined. For example, "at least 1" means 1 or more than 1. The term "at most" followed by a number is used herein to denote the end of a range ending with that number, which may be a range having 1 or 0 as its lower limit, or a range having no lower limit, depending upon the variable being defined. For example, "at most 4" means 4 or less than 4, and "at most 40%" means 40% or less than 40%. When, in this specification, a range is given as "(a first number) to (a second number)" or "(a first number)-(a second number)," this means a range whose lower limit is the first number and whose upper limit is the second number. For example, "25 to 100 nm" means a range whose lower limit is 25 nm and whose upper limit is 100 nm.

Figure 6A:
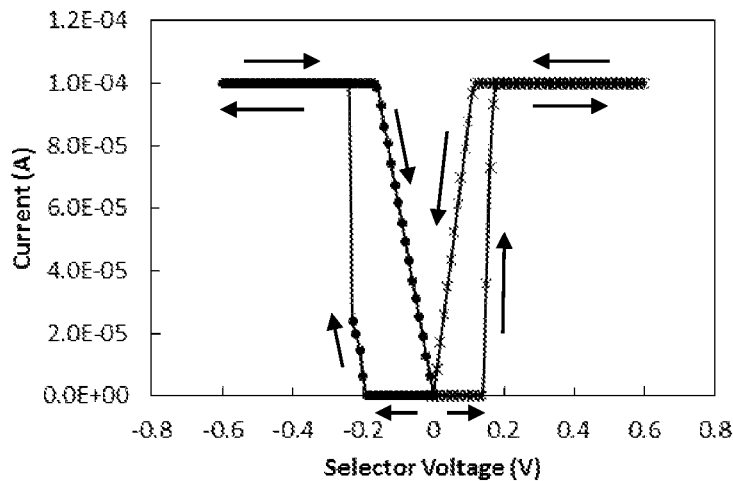
FIGS. 6A-6C are I-V response plots for a selector, an MTJ memory element, and a memory cell comprising the selector and the MTJ memory element coupled in series, respectively.
Figure 6A:
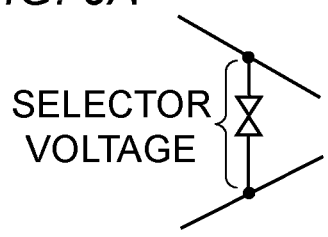
Figure 6B:
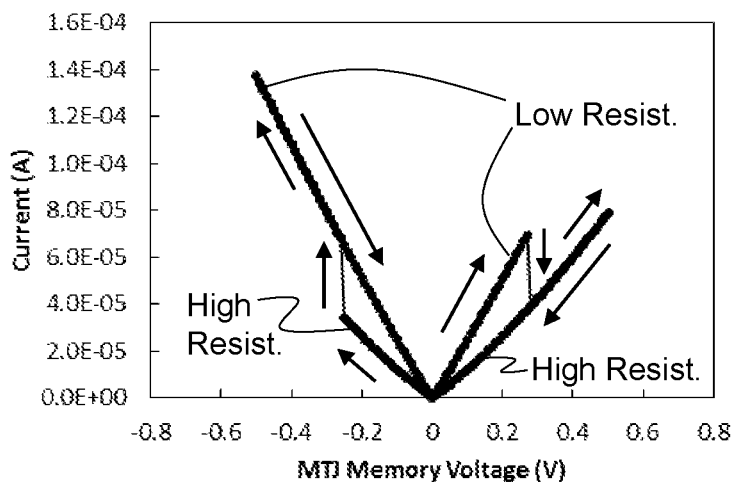
Figure 6B:
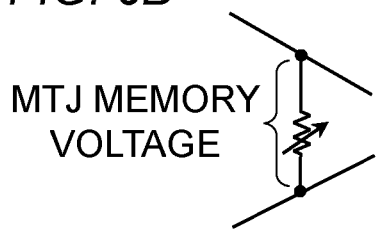
Figure 6C:
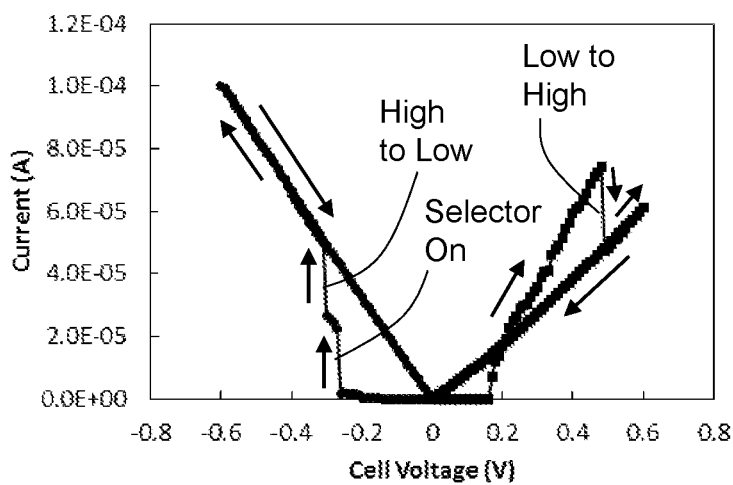
Figure 6C:
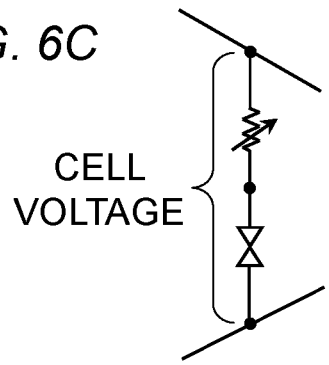

FIGS. 6A-6C show I-V response plots for a two-terminal selector, an MTJ memory element, and a memory cell comprising the two-terminal selector and the MTJ memory cell coupled in series, respectively. The I-V response plot of FIG. 6A shows the magnitude of electric current passing through the two-terminal selector as the voltage applied thereto varies between +0.6 and −0.6 V. As the applied voltage increases from 0 to 0.6 V, the selector turns on or becomes substantially conductive at about 0.17 V (threshold voltage), which is characterized by the rapid increase in the current passing through the selector. At the selector voltage of about 0.2 V, the selector current reaches a maximum value of about 100 µA (compliance current) and remains at essentially the same level until 0.6 V. As the selector voltage decreases from 0.6 to 0 V, the selector current remains at about 100 µA until about 0.1 V (holding voltage), below which the selector current rapidly drops off to indicate the selector becoming nominally insulative again. As the polarity of the applied voltage to the selector is reversed (i.e. between 0 and −0.6 V), the current flow is reversed and reaches a maximum value of about 100 µA (compliance current) at about −0.2 V and beyond. The selector current stays at the maximum level as the selector voltage varies from −0.6 to about −0.1 V (holding voltage), beyond which the selector current rapidly drops off. The I-V response curve of the selector in the negative voltage region is analogous to that in the positive voltage region with the two curves being substantially symmetric with respect to a vertical axis at Selector Voltage=0 (not shown).

FIG. 6B shows the magnitude of electric current passing through the MTJ memory element as the voltage applied thereto varies between +0.5 and −0.5 V. As the applied voltage to the MTJ memory element increases from 0 to 0.5 V, the current passing through the MTJ memory element continually increases but with an abrupt drop at about 0.28 V (switching voltage), indicating the transition from low to high resistance state. Further increase in the voltage does not change the resistance state. As the polarity of the voltage applied to the MTJ memory element is reversed (i.e. 0 to −0.5 V), the MTJ memory current continually increases and experiences an abrupt jump at about −0.25 V (switching voltage), indicating the transition from high to low resistance state. Therefore, the I-V response plot of FIG. 6B shows the MTJ memory element having relatively symmetric switching voltages.

Figure 1:
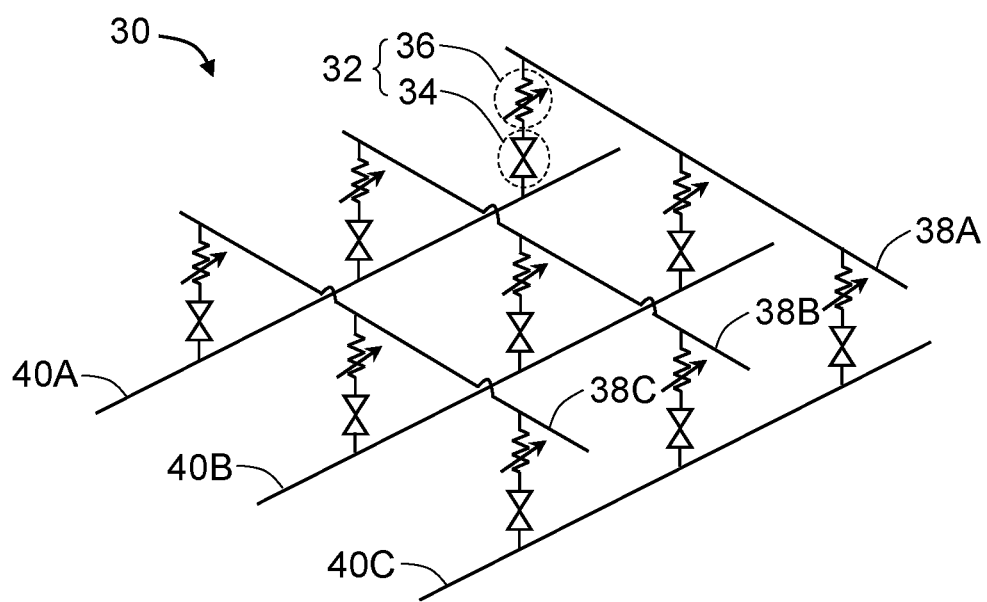
FIG. 1 is a schematic circuit diagram of a memory array that includes a plurality of memory cells between two sets of parallel wiring lines.
Figure 2:
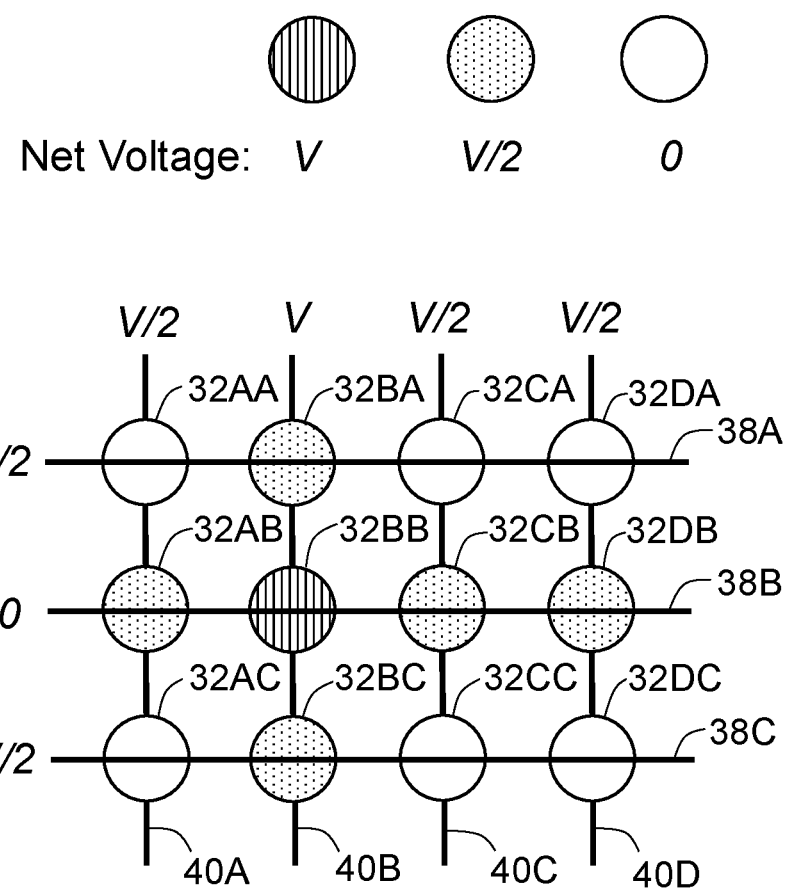
FIG. 2 illustrates a scheme for programming a memory cell in the memory array of FIG. 1.
Figure 4:
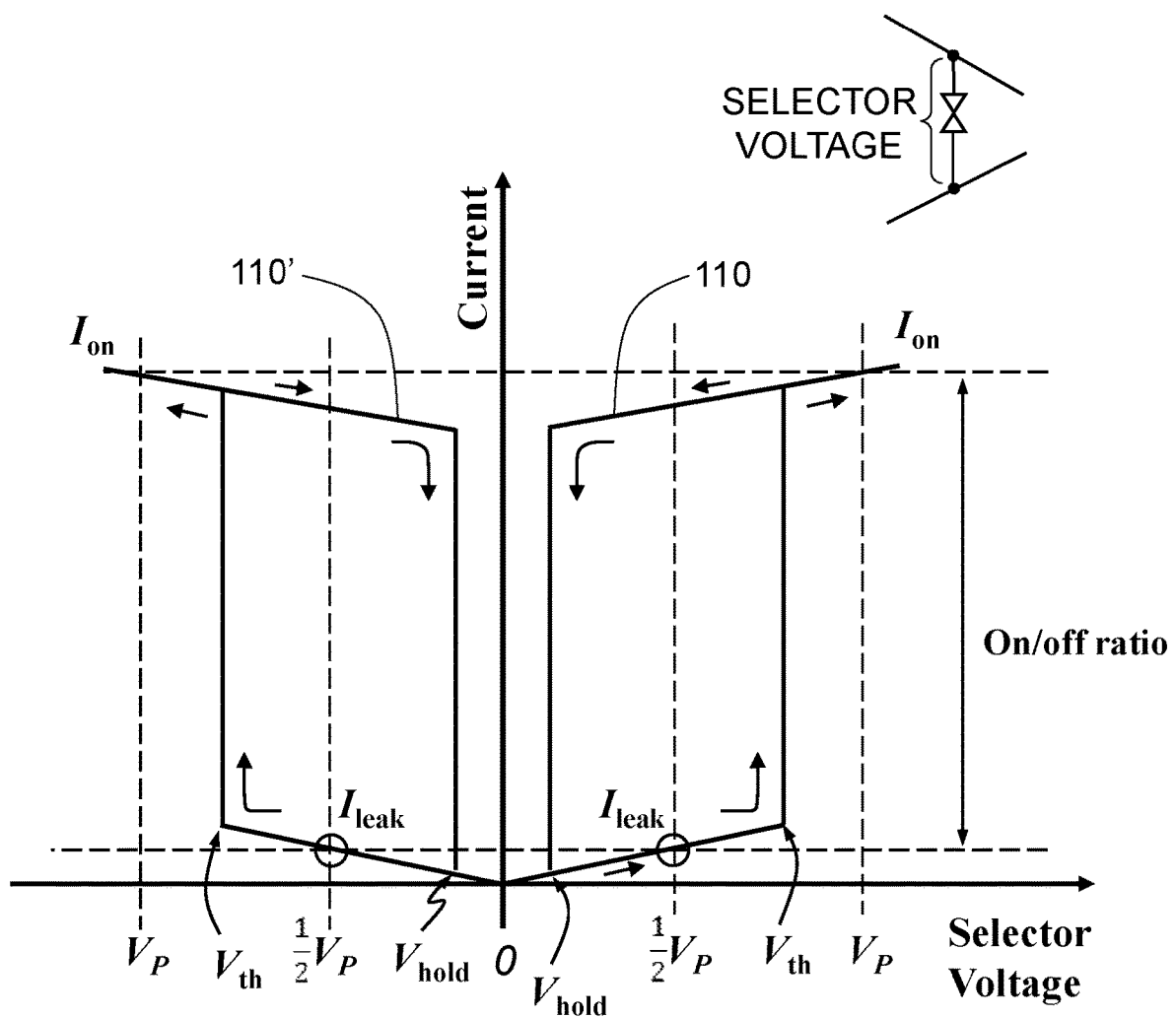
FIG. 4 is an I-V response plot for a conventional two-terminal selector having symmetric conductance.
Figure 5:
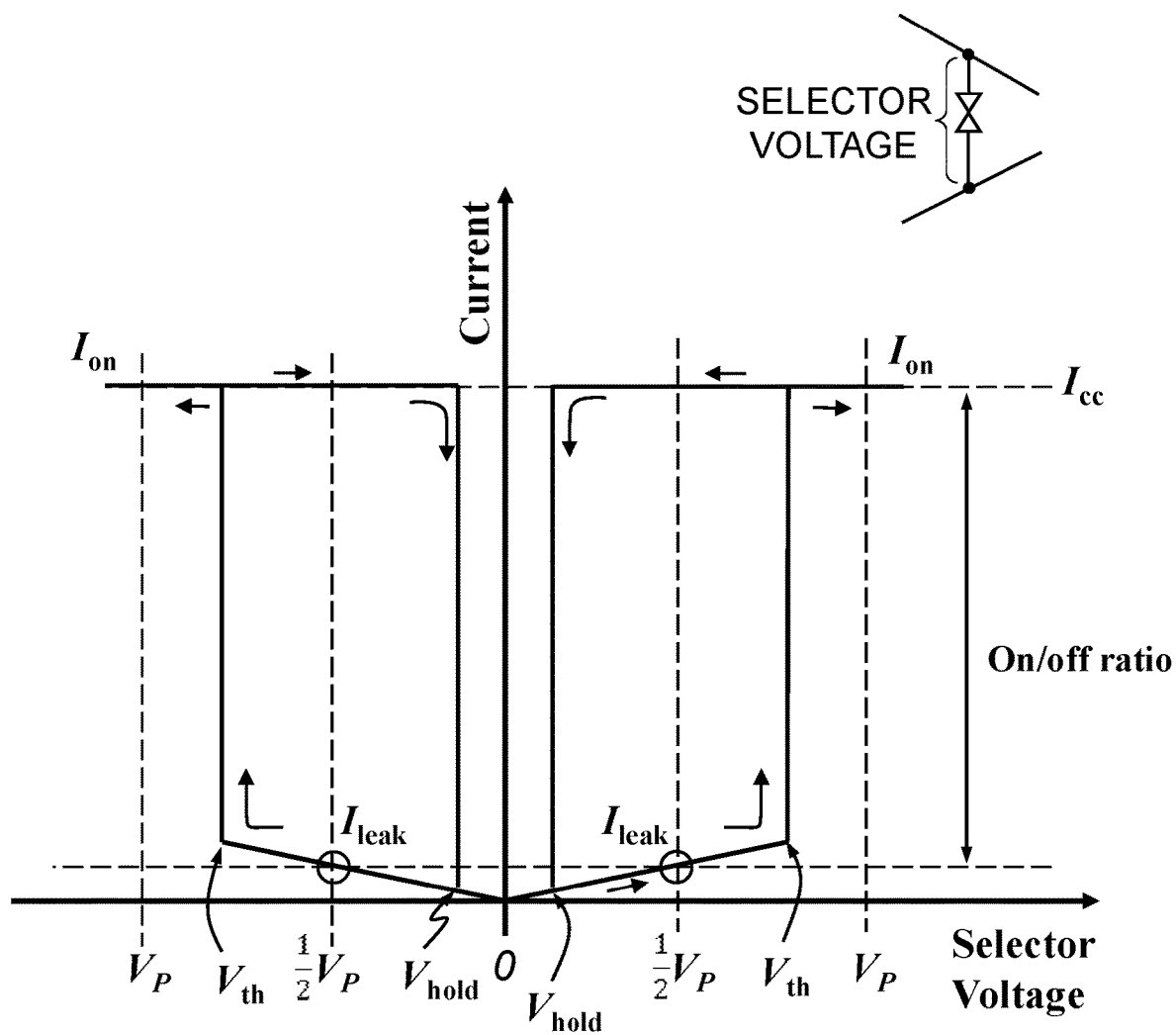
FIG. 5 is another I-V response plot for a conventional two-terminal selector having symmetric conductance.

FIG. 6C shows the magnitude of electric current passing through the memory cell as the voltage applied thereto varies between +0.6 and −0.6 V. The memory cell includes the selector having the I-V response shown in FIG. 6A and the MTJ memory element having the I-V response shown in FIG. 6B coupled in series. Since the voltage is applied to the memory cell at two ends thereof via two wiring lines as shown in FIG. 1, only the memory cell voltage is controlled, not the individual selector voltage or MTJ memory voltage. While the selector and the MTJ memory element individually show relatively symmetric on/off or switching behavior, the memory cell formed by the selector and the MTJ memory element coupled in series exhibit asymmetric switching behavior. For example, FIG. 6C shows the MTJ memory element having switching voltages of about 0.49 (low to high resistance) and 0.32 V (high to low resistance), a difference of 0.17 V, when coupled to the selector. The asymmetric switching behavior of the MTJ memory element in the memory cell is due to the difference in the net or effective voltage that the MTJ memory element experiences when the same element is in different resistance states. When a voltage is applied to the memory cell, the net or effective voltage on the MTJ memory element will be lower when the MTJ memory element is in the low resistance state compared with the high resistance state. Therefore, a higher memory cell voltage (~0.49 V) is required to switch the MTJ memory element from the low to high resistance state.

Since the capacity of the power supply for a memory circuit is mostly dictated by the programming current used in the programming operation, it is desirable to balance the switching voltages of the memory cell to reduce the power supply voltage and to minimize power consumption. Moreover, the balancing of the switching voltages may prevent unintended high to low resistance switching when the selector is turn on for a sense or read operation because the close proximity between the selector turn-on voltage and the MTJ switching voltage as shown in FIG. 6C.

The switching voltages of a memory cell made of an MTJ memory element and a selector coupled in series may be balanced by modifying the switching behavior of the MTJ memory element to be asymmetric and/or modifying the conductance of the selector to be asymmetric.

Figure 7:
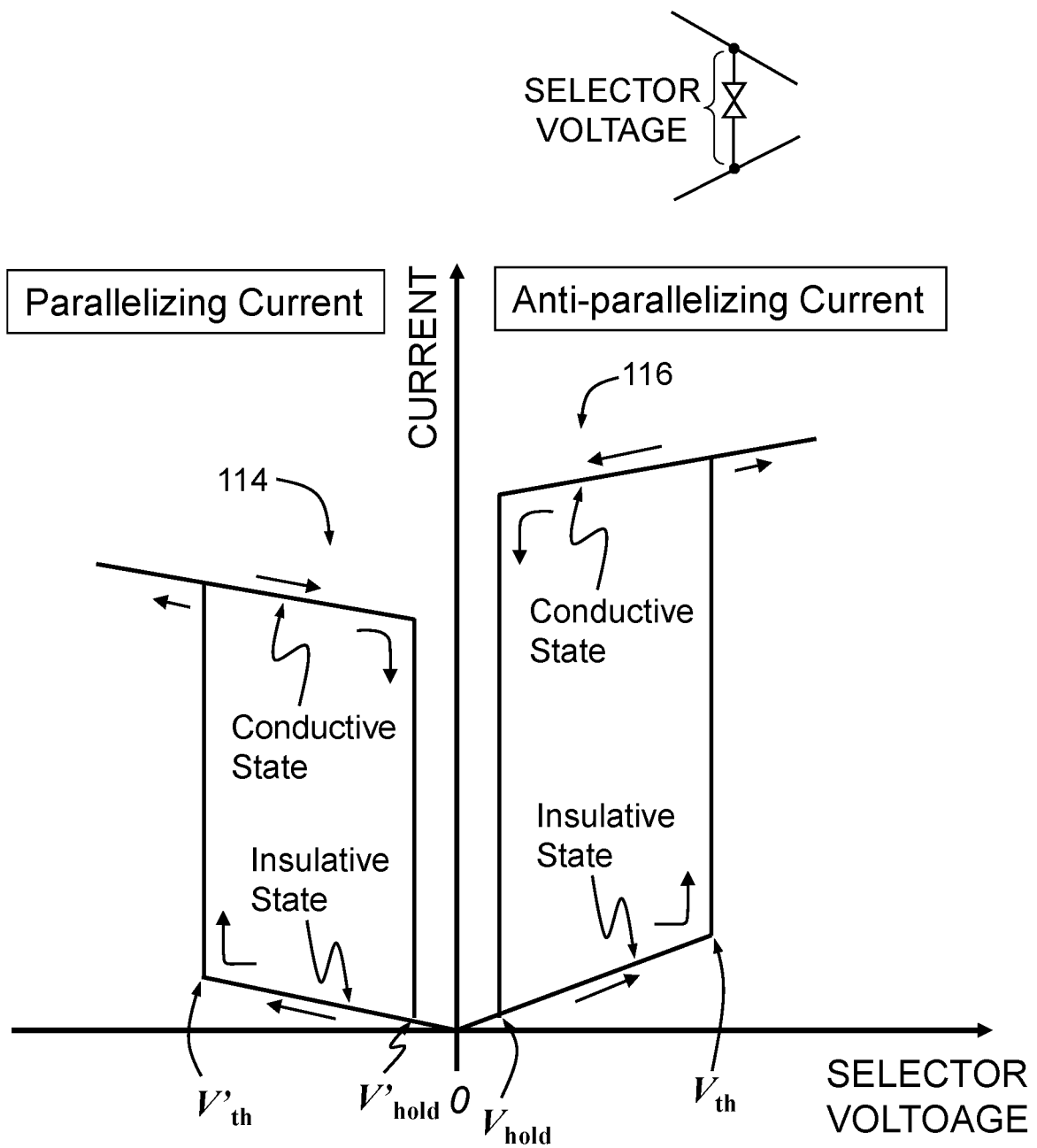
FIG. 7 is an I-V response plot for a two-terminal selector having asymmetric conductance in accordance with an embodiment of the present invention.

Accordingly, an embodiment of the present invention as applied to a memory cell includes an MTJ memory element coupled to a selector with asymmetric conductance. FIG. 7 shown an exemplary I-V response plot for the asymmetric selector without a load coupled thereto. The two I-V response curves 114 and 116 correspond to the directions of parallelizing (high to low MTJ resistance) and anti-parallelizing (low to high MTJ resistance) currents, respectively. As explained above and illustrated in FIG. 3, the parallelizing current ($i^p$) flows in the direction from the free layer to the reference layer, while the anti-parallelizing current ($i^{ap}$) flows in the opposite direction. The I-V response curves 114 and 116 of FIG. 7 show the selector in the conductive state having a higher selector current in the direction of anti-parallelizing current than in the direction of parallelizing current at the same absolute selector voltage. Therefore, the selector in the conductive ("on") state has a higher conductance or lower resistance in the direction of anti-parallelizing current than in the direction of parallelizing current.

With continuing reference to the I-V response plot of FIG. 7, the threshold voltages (absolute values) $V_{th}$ and $V'_{th}$ of the asymmetric selector in the anti-parallelizing and parallelizing current directions, respectively, may be different or substantially the same. In an embodiment, $V_{th}$ is greater than $V'_{th}$. In an alternative embodiment, $V'_{th}$ is greater than $V_{th}$. Similarly, the holding voltages (absolute values) $V_{hold}$ and $V'_{hold}$ in the anti-parallelizing and parallelizing current directions, respectively, may be different or substantially the same. In an embodiment, $V_{th}$ is greater than $V'_{th}$. In an alternative embodiment, $V'_{th}$ is greater than $V_{th}$. The I-V slopes in the nominally insulative ("off") state along the anti-parallelizing and parallelizing current directions, respectively, may be different or substantially the same. In an embodiment, the I-V slope in the nominally insulative state along the anti-parallelizing current direction is greater than that along the parallelizing current direction. In an alternative embodiment, the I-V slope in the nominally insulative state along the parallelizing current direction is greater than that along the anti-parallelizing current direction. Analogously, the I-V slopes in the conductive ("on") state along the anti-parallelizing and parallelizing current directions, respectively, may be different or substantially the same. In an embodiment, the I-V slope in the conductive state along the anti-parallelizing current direction is greater than that along the parallelizing current direction. In an alternative embodiment, the I-V slope in the conductive state along the parallelizing current direction is greater than that along the anti-parallelizing current direction.

Figure 8:
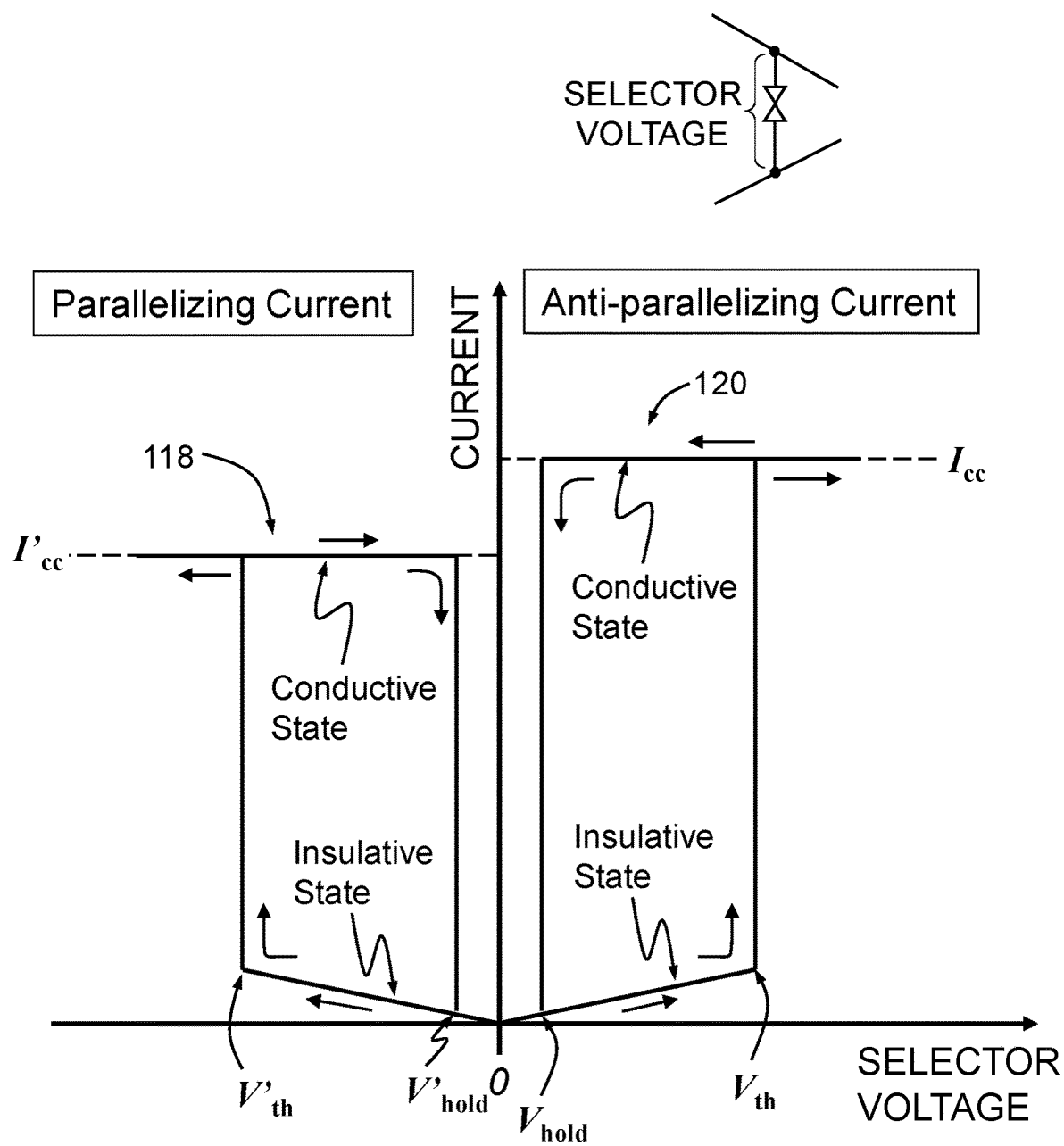
FIG. 8 is an I-V response plot for a two-terminal selector having asymmetric conductance in accordance with another embodiment of the present invention.

The selector with asymmetric conductance may alternatively exhibit the exemplary I-V response curves 118 and 120 shown in FIG. 8. The I-V response plot of FIG. 8 is analogous to that of FIG. 7 except that the selector currents $I_{cc}$ and $I'_{cc}$ in the conductive state along the anti-parallelizing and parallelizing current directions, respectively, remain relatively constant with selector voltage. The selector current ($I_{cc}$) in the conductive state along the direction of the anti-parallelizing current is higher than the selector current ($I'_{cc}$) along the direction of parallelizing current. Therefore, the selector in the conductive ("on") state has a higher conductance or lower resistance in the direction of anti-parallelizing current than in the direction of parallelizing current.

Figure 9A:
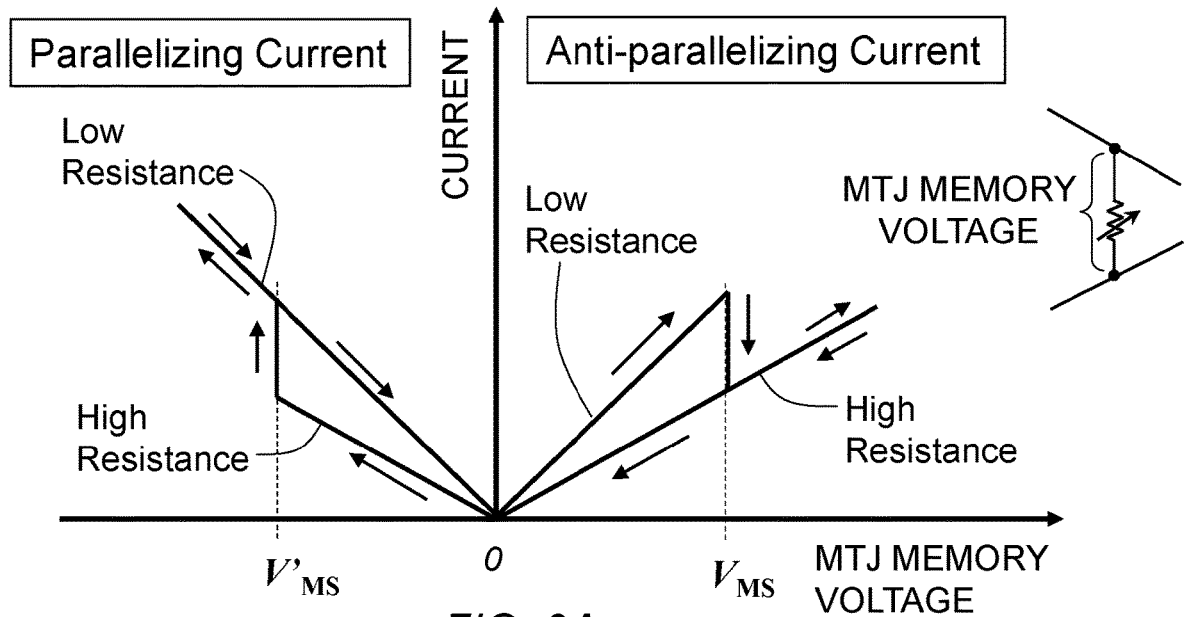
FIG. 9A is an I-V response plot for an MTJ memory element having symmetric switching voltages in accordance with an embodiment of the present invention.
Figure 9B:
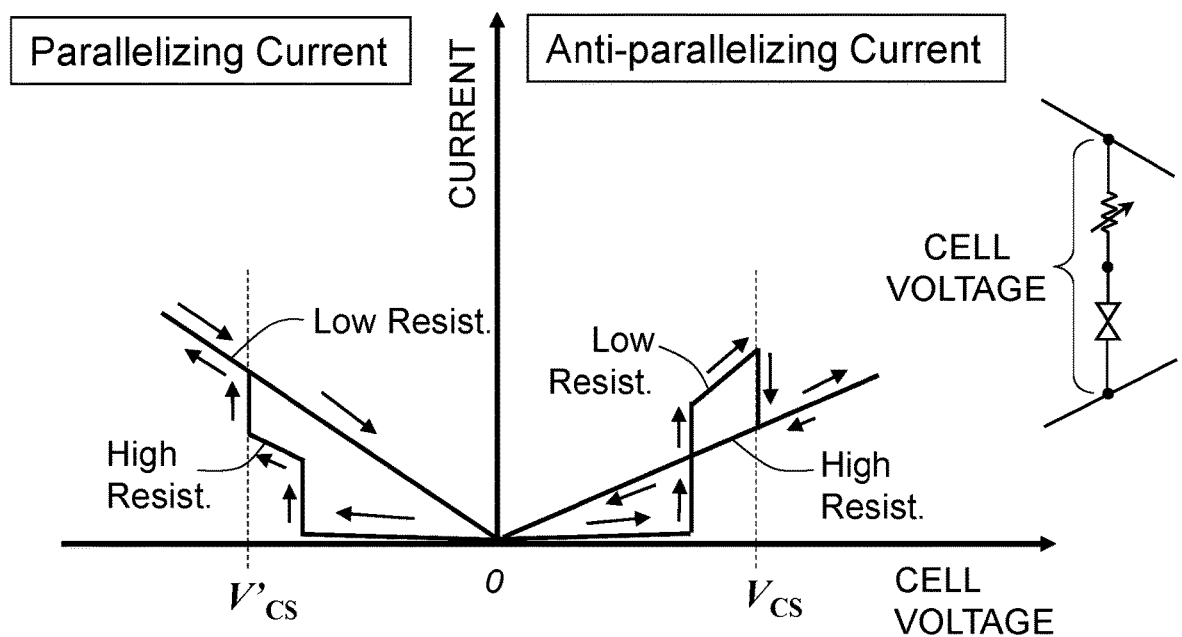
FIG. 9B is an I-V response plot for a memory cell having symmetric switching voltages in accordance with an embodiment of the present invention.

In an embodiment of the present invention, the applied voltages to the memory cell, which includes the selector exhibiting the asymmetric I-V response characteristics shown and described with reference to FIG. 7 or FIG. 8, for switching the resistance of the MTJ memory element from the low to high state ($V_{CS}$) and from the high to low state ($V'_{CS}$), respectively, are substantially the same as shown in FIG. 9B. In another embodiment, the switching voltages of the MTJ memory element from the low to high state ($V_{MS}$) and from the high to low state ($V'_{MS}$), respectively, are substantially the same as shown in FIG. 9B. In still another embodiment, the memory cell with substantially symmetric cell switching voltages ($V_{CS}$ and $V'_{CS}$) as shown in FIG. 9B includes the MTJ memory element exhibiting substantially symmetric memory switching voltages ($V_{MS}$ and $V'_{MS}$) as shown in FIG. 9A coupled to the selector exhibiting the asymmetric conductance as shown and described with reference to FIG. 7 or FIG. 8.

Figure 10A:
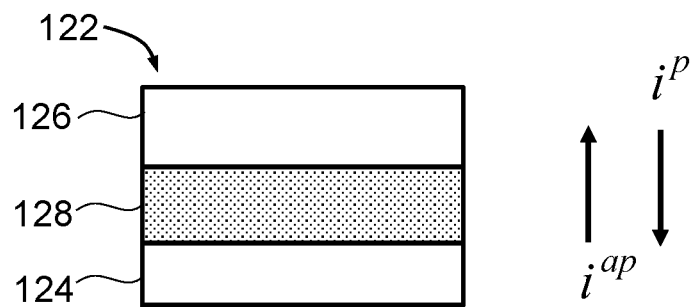
FIG. 10A is a cross sectional view of an exemplary selector structure in accordance with an embodiment of the present invention.

FIG. 10A shows a cross sectional view of an exemplary structure 122 for the selector, which may include a first electrode 124 and a second electrode 126 with a switching layer 128 interposed therebetween. The anti-parallelizing current flows in the direction from the first electrode 124 to the second electrode 126, while the parallelizing current flows in the opposite direction. Each of the first and second electrodes 124 and 126 may be made of a suitable conductor, such as but not limited to Cu, $CuGe_x$, Ni, Ag, Pt, Pd, Cr, Co, Fe, Al, Au, Ir, Ru, Ti, $TiN_x$, Ta, $TaN_x$, W, $WN_x$, Mo, $MoN_x$, Zr, $ZrN_x$, Hf, $HfN_x$, Nb, $NbN_x$, Zn, or any combination thereof. In an embodiment, the first and second electrodes 124 and 126 are made of a same material. In an alternative embodiment, the first and second electrodes 124 and 126 are made of different materials. For example, the first electrode 124 is made of silver (Ag) metal and the second electrode 126 is made of copper (Cu) or zinc (Zn) metal. The first and second electrodes 124 and 126 may have different thicknesses. In an embodiment, the first electrode 124 is thicker than the second electrode 126.

Figure 10B:
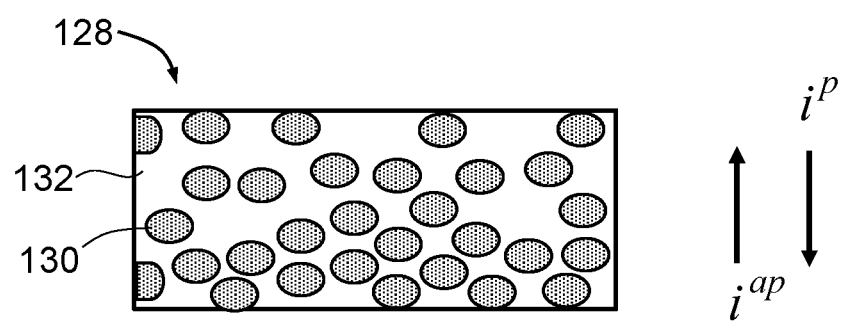
FIGS. 10B and 10C are cross sectional views of two exemplary structures for the switching layer in the exemplary selector structure of FIG. 10A.

The switching layer 128 may be made of a nominally insulating material or any suitable material that switches its resistance in the presence of an applied field or current, such as but not limited to $SiO_x$, $VO_x$, $NbO_x$, $TaO_x$, $TiO_x$, $WO_x$, $HfO_x$, $ZrO_x$, $NiO_x$, $FeO_x$, $YO_x$, $EuO_x$, $CuGe_xS_y$, $CuAg_xGe_yS_z$, $GeSb_xTe_y$, $AgIn_xSb_yTe_z$, $GeTe_x$, $SbTe_x$, $GeSb_x$, $CrO_x$, $SrTi_xO_y$, or any combination thereof. The nominally insulating switching layer 128 may further include one or more metallic dopants, such as but not limited to Ag, Au, Zn, and Cu. Alternatively, the switching layer 128 may comprise a plurality of metal-rich clusters 130 embedded in a nominally semi-conducting or insulating matrix 132 as illustrated in FIG. 10B. The matrix 132 of the switching layer 128 may be made of a suitable stoichiometric or near-stoichiometric insulator compound, or a suitable non-stoichiometric insulator compound, or a suitable chalcogenide, or a suitable solid electrolyte, or any combination thereof. Examples of the suitable stoichiometric or near-stoichiometric insulator compound include silicon oxide ($SiO_2$), silicon nitride ($Si_3N_4$), aluminum oxide ($Al_2O_3$), magnesium oxide (MgO), tantalum oxide ($Ta_2O_5$), vanadium oxide ($V_2O_5$), niobium oxide ($Nb_2O_5$), titanium oxide ($TiO_2$), tungsten oxide ($WO_3$), hafnium oxide ($HfO_2$), zirconium oxide ($ZrO_2$), nickel oxides (NiO, $Ni_2O_3$), iron oxide ($Fe_2O_3$), yttrium oxide ($Y_2O_3$), europium oxide ($Eu_2O_3$), and any combinations thereof. Examples of the suitable non-stoichiometric oxide include $SiO_x$, $SiN_x$, $AlO_x$, $MgO_x$, $TaO_x$, $VO_x$, $NbO_x$, $TaO_x$, $TiO_x$, $WO_x$, $HfO_x$, $ZrO_x$, $NiO_x$, $FeO_x$, $YO_x$, $EuO_x$, and any combinations thereof. Examples of the suitable chalcogenide include GeTe, $Sb_2Te_3$, GeSb, $Ge_2Sb_2Te_5$, $GeSbTe_2$, $Sb_3Te_7$, and any combinations thereof. The suitable solid electrolyte for the matrix 132 may comprise one or more of the following elements: Ge, Sb, S, Se, In, Ga, Sn, As, and Te.

With continuing reference to FIG. 10B, the plurality of metal-rich clusters 130 may be made of a noble metal, or an alloy including one or more noble metals, or a fast electric field enhanced diffuser material, or any combination thereof. Examples of the noble metal include gold (Au), silver (Ag), platinum (Pt), palladium (Pd), rhodium (Rh), iridium (Ir), ruthenium (Ru), osmium (Os), and rhenium (Re). Examples of the fast electric field enhanced diffuser material include nickel (Ni), copper (Cu), silver (Ag), gold (Au), zinc (Zn), cobalt (Co), iron (Fe), tungsten (W), molybdenum (Mo), tantalum (Ta), niobium (Nb), aluminum (Al), titanium (Ti), zirconium (Zr), titanium nitride (TiN), zirconium nitride (ZrN), tantalum nitride (TaN), niobium nitride (NbN), and tungsten nitride (WN). In an embodiment, the plurality of metal-rich clusters 130 are made of a same material as at least one of the first and second electrodes 124 and 126. In another embodiment, the concentration of the plurality of metal-rich clusters 130 in the matrix 132 decreases along the direction of the anti-parallel current (i.e. from the first electrode 124 to the second electrode 126).

Figure 10C:
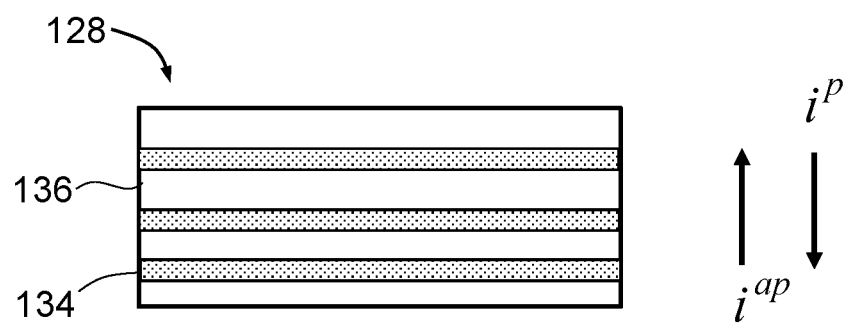

Still alternatively, the switching layer 128 may comprise one or more layers of a conductive material 134 interleaved with two or more layers of a nominally semi-conducting or insulating material 136 as illustrated in FIG. 10C. The conductive layers 134 may be made of any of the suitable conductive materials described above for the metal-rich clusters 130. The thickness of the conductive layers 134 may range from several angstroms to several nanometers. In some cases where the conductive layers 134 are extremely thin, one or more of the conductive layers 134 may be punctured by holes, thereby rendering the layer coverage to be discontinuous in some regions. Similarly, the nominally semi-conducting or insulating layers 136 may be made of any of the suitable semi-conducting or insulating materials described above for the matrix 132. In an embodiment, the conductive layers 134 are made of a same material as at least one of the first and second electrodes 124 and 126. In another embodiment, the thicknesses of the conductive layers 134 decrease and/or the thicknesses of the insulating layers 136 increase along the direction of the anti-parallelizing current.

Figure 11A:
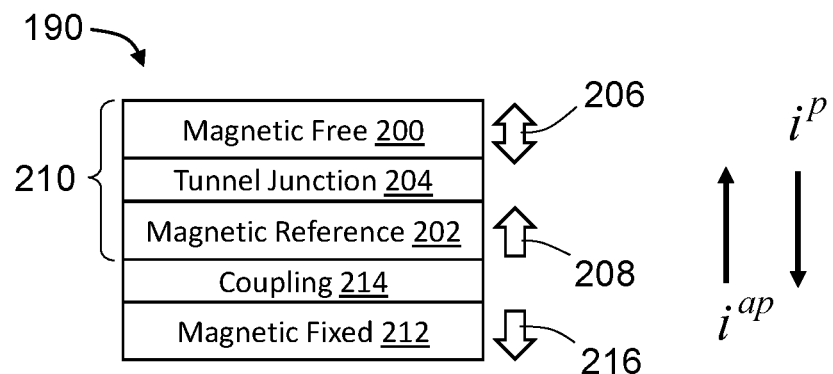
FIGS. 11A and 11B are cross sectional views of two exemplary structures for an MTJ memory element in accordance with an embodiment of the present invention.

FIG. 11A shows an exemplary structure 190 for the MTJ memory element that includes a magnetic free layer 200 and a magnetic reference layer 202 with a tunnel junction layer 204 interposed therebetween. The magnetic free layer 200 has a variable magnetization direction 206 substantially perpendicular to the layer plane thereof. The magnetic reference layer 202 has a first fixed magnetization direction 208 substantially perpendicular to the layer plane thereof. The magnetic free layer 200, the tunnel junction layer 204, and the magnetic reference layer 202 collectively form a magnetic tunnel junction 210. The exemplary structure 190 may further include a magnetic fixed layer 212 exchange coupled to the magnetic reference layer 202 through an anti-ferromagnetic coupling layer 214. The magnetic fixed layer 212 has a second fixed magnetization direction 216 that is substantially perpendicular to the layer plane thereof and is substantially opposite to the first magnetization direction 208 of the magnetic reference layer 202. In an embodiment, the switching voltage of the MTJ structure 190 from the low resistance state to the high resistance state is substantially same as the switching voltage from the high resistance state to the low resistance state by adjusting the offset field, which is the net external magnetic field acting on the magnetic free layer 200 along the direction of perpendicular magnetization 208. In another embodiment, the stray magnetic fields exerted on the magnetic free layer 200 by the magnetic reference and fixed layers 202 and 212, respectively, substantially cancel each other, thereby rendering the offset field to be substantially zero or negligible.

Figure 11B:
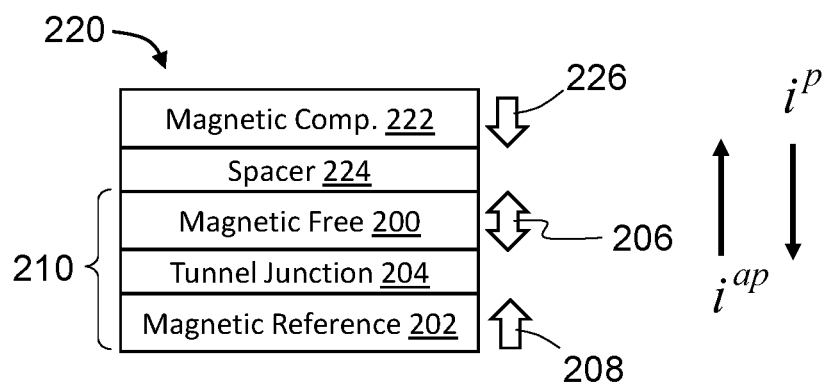

Another exemplary structure 220 for the MTJ memory element, as illustrated in FIG. 11B, includes the magnetic tunnel junction 210 and a magnetic compensation layer 222 separated from the magnetic free layer 200 by a non-magnetic spacer layer 224. The magnetic compensation layer 222 has a third fixed magnetization direction 226 that is substantially perpendicular to the layer plane thereof and is substantially opposite to the first magnetization direction 208 of the magnetic reference layer 202. The magnetic compensation layer 222 is used to generate a magnetic field opposing that exerted by the magnetic fixed layer 202 on the magnetic free layer 200. In an embodiment, the switching voltage of the MTJ structure 220 from the low resistance state to the high resistance state is substantially same as the switching voltage from the high resistance state to the low resistance state by adjusting the offset field. In another embodiment, the stray magnetic fields exerted on the magnetic free layer 200 by the magnetic reference and compensation layers 202 and 222, respectively, substantially cancel each other, thereby rendering the offset field to be substantially zero or negligible.

The magnetic free layer 200, the magnetic reference layer 202, the magnetic fixed layer 212, and the magnetic compensation layer 222 of the above structures 190 and 220 may be made of any suitable magnetic material or structure. One or more of the magnetic layers 200, 202, 212, and 222 may comprise at least one ferromagnetic element, such as but not limited to cobalt (Co), nickel (Ni), or iron (Fe), to form a suitable magnetic material, such as but not limited to Co, Ni, Fe, CoNi, CoFe, NiFe, or CoNiFe. The magnetic material of the one or more of the magnetic layers 200, 202, 212, and 222 may further include one or more non-magnetic elements, such as but not limited to boron (B), titanium (Ti), zirconium (Zr), hafnium (Hf), vanadium (V), niobium (Nb), tantalum (Ta), chromium (Cr), molybdenum (Mo), tungsten (W), aluminum (Al), silicon (Si), germanium (Ge), gallium (Ga), oxygen (O), nitrogen (N), carbon (C), platinum (Pt), palladium (Pd), ruthenium (Ru), samarium (Sm), neodymium (Nd), antimony (Sb), iridium (Ir) or phosphorus (P), to form a magnetic alloy or compound, such as but not limited to cobalt-iron-boron (CoFeB), iron-platinum (FePt), cobalt-platinum (CoPt), cobalt-iron-boron-titanium (CoFeBTi), cobalt-iron-boron-zirconium, (CoFeBZr), cobalt-iron-boron-hafnium (CoFeBHf), cobalt-iron-boron-vanadium (CoFeBV), cobalt-iron-boron-tantalum (CoFeBTa), cobalt-iron-boron-chromium (CoFeBCr), cobalt-iron-titanium (CoFeTi), cobalt-iron-zirconium (CoFeZr), cobalt-iron-hafnium (CoFeHf), cobalt-iron-vanadium (CoFeV), cobalt-iron-niobium (CoFeNb), cobalt-iron-tantalum (CoFeTa), cobalt-iron-chromium (CoFeCr), cobalt-iron-molybdenum (CoFeMo), cobalt-iron-tungsten (CoFeW), cobalt-iron-aluminum (CoFeAl), cobalt-iron-silicon (CoFeSi), cobalt-iron-germanium (CoFeGe), iron-zirconium-boron (FeZrB), samarium-cobalt (SmCo), neodymium-iron-boron (NdFeB), cobalt-iron-antimony (CoFeSb), cobalt-iron-iridium (CoFeIr), or cobalt-iron-phosphorous (CoFeP).

Some of the above-mentioned magnetic materials, such as Fe, CoFe, CoFeB may have a body-centered cubic (BCC) lattice structure that is compatible with the halite-like cubic lattice structure of MgO, which may be used as the insulating tunnel junction layer 126. CoFeB alloy used for one or more of the magnetic layers 200, 202, 212, and 222 may contain more than 40 atomic percent Fe or may contain less than 30 atomic percent B or both.

One or more of the magnetic layers 200, 202, 212, and 222 may alternatively have a multilayer structure formed by interleaving one or more layers of a first type of material with one or more layers of a second type of material with at least one of the two types of materials being magnetic, such as but not limited to [Co/Pt], [Co/Pd], [Co/Pt(Pd)], [Co/Ni], [Co/Ir], [CoFe/Pt], [CoFe/Pd], [CoFe/Pt(Pd)], [CoFe/Ni], [CoFe/Ir], or any combination thereof. The multilayer structure may have a face-centered cubic (FCC) type of lattice structure, which is different from the body-centered cubic structure (BCC) of some ferromagnetic materials, such as Fe, CoFe, and CoFeB, and the halite-like cubic lattice structure of magnesium oxide (MgO) that may be used as the insulating tunnel junction layer 204. All individual magnetic layers of a magnetic multilayer structure may have the same magnetization direction. The multilayer structure may or may not exhibit the characteristic satellite peaks associated with superlattice when analyzed by X-ray, neutron diffraction, or other diffraction techniques.

Still alternatively, one or more of the magnetic layers 200, 202, 212, and 222 may comprise two, three, four, or more magnetic sublayers with each magnetic sublayer being made of any suitable magnetic material, including magnetic metal, alloy, compound, or multilayer structure as described in the preceding paragraphs above.

The anti-ferromagnetic coupling layer 214 of the MTJ structure 190 may be made of a suitable anti-ferromagnetic coupling material, such as but not limited to ruthenium (Ru), vanadium (V), niobium (Nb), tantalum (Ta), chromium (Cr), molybdenum (Mo), tungsten (W), manganese (Mn), rhenium (Re), osmium (Os), rhodium (Rh), iridium (Ir), copper (Cu), or any combination thereof.

Figure 12A:
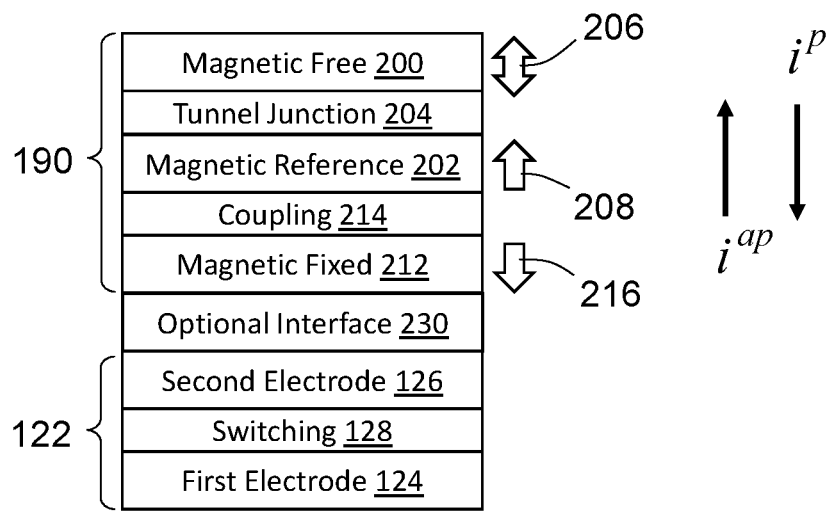
FIGS. 12A and 12B are cross sectional views of two exemplary structures for a memory cell formed by integrating the selector of FIG. 10A and the MTJ memory element of FIG. 11A.

FIG. 12A is a cross sectional view of a memory cell formed by integrating the MTJ memory element having the exemplary structure 190 shown in FIG. 11A and the selector having the exemplary structure 122 shown in FIG. 10A. The second electrode 126 of the selector 122 is formed adjacent to the magnetic fixed layer 212. In some embodiments, the memory cell of FIG. 12A includes an optional interface layer structure 230 between the magnetic fixed layer 212 and the second electrode 126. The optional interface layer structure 230 may include one or more interface layers with each layer being made of a suitable material, such as but not limited to Ta, TaN, Ru, Ir, Rh, Ti, TiN, Zr, ZrN, Hf, HfN, V, VN, Nb, NbN, Cr, Mo, W, NiCr, FeNiCr, NiTi, NiTa, NiZr, NiHf, NiV, NiNb, NiMo, NiW, TiSi, NiSi, CoSi, CoCr, CoTi, CoTa, CoZr, CoHf, CoV, CoNb, CoMo, CoW, MgO, or any combination thereof. Each of the one or more interface layers may alternatively have a multilayer structure with one or more layers of a first material interleaved with one or more layers of a second material. The first material may be Co or Ni and the second material may be Cr, Mo, W, Ta, Nb, V, Ti, Zr, Hf, Ir, or Rh. For example, the optional interface layer structure 230 may include a tantalum layer formed adjacent to the second electrode 126 and a [Co/Ni] multilayer structure formed adjacent to the magnetic fixed layer 212. Alternatively, the optional interface layer structure 230 may include a tantalum layer formed adjacent to the second electrode 126 and a NiCr layer formed adjacent to the magnetic fixed layer 212. Still alternatively, the optional interface layer structure 230 may include a layer of tantalum nitride (TaN) or titanium nitride (TiN).

Figure 12B:
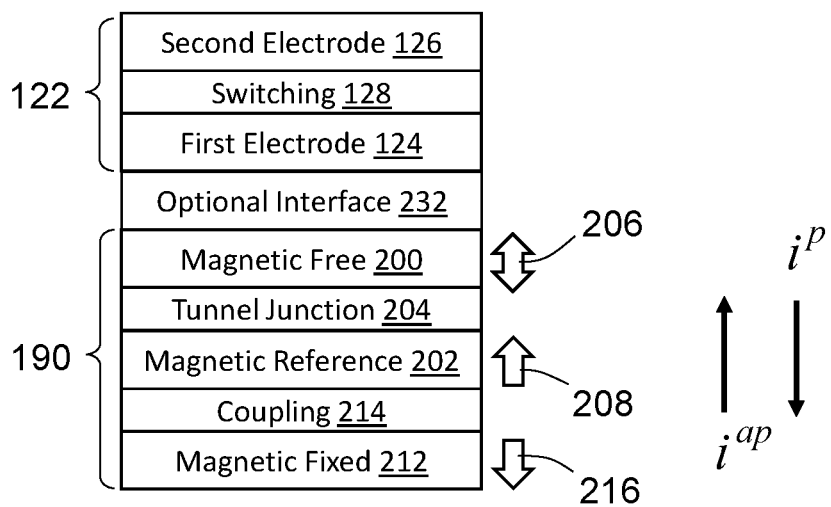

The MTJ memory element having the exemplary structure 190 shown in FIG. 11A and the selector having the exemplary structure 122 shown in FIG. 10A may be alternatively integrated by disposing the first electrode 124 of the selector 122 adjacent to the magnetic free layer 220 as shown in FIG. 12B. In some embodiments, the memory cell of FIG. 12B includes an optional interface layer structure 232 between the magnetic free layer 200 and the first electrode 124. The optional interface layer structure 232 may include one or more interface layers with each layer being made of a suitable material, such as but not limited to Ta, TaN, Ru, Ir, Rh, Ti, TiN, Zr, ZrN, Hf, HfN, V, VN, Nb, NbN, Cr, Mo, W, NiCr, FeNiCr, NiTi, NiTa, NiZr, NiHf, NiV, NiNb, NiMo, NiW, TiSi, NiSi, CoSi, CoCr, CoTi, CoTa, CoZr, CoHf, CoV, CoNb, CoMo, CoW, MgO, or any combination thereof. Each of the one or more interface layers may alternatively have a multilayer structure with layers of a first material interleaved with layers of a second material. The first material may be Co or Ni and the second material may be Cr, Mo, W, Ta, Nb, V, Ti, Zr, Hf, Ir, or Rh. For example, the optional interface layer structure 232 may include an MgO layer formed adjacent to the magnetic free layer 200 and a ruthenium (Ru) layer formed adjacent to the first electrode 124. Alternatively, the optional interface layer structure 232 may include a tantalum formed adjacent to the first electrode 124 and a ruthenium layer formed adjacent to the magnetic free layer 200. Still alternatively, the optional interface layer structure 232 may include multiple layers with one MgO layer formed adjacent to the magnetic free layer 200. Yet alternatively, the optional interface layer structure 232 may include a layer of tantalum nitride (TaN) or titanium nitride (TiN). It should be noted that the stacking order of the layers in the structures of FIGS. 12A and 12B may be reversed without affecting the device performance.

The MTJ memory element having the exemplary structure 220 shown in FIG. 11B and the selector having the exemplary structure 122 shown in FIG. 10A can be similarly integrated as described above for integrating the structures 190 and 122. The selector having the exemplary structure 122 can be attached to the MTJ memory element 220 at either the magnetic compensation layer 222 or the magnetic reference layer 202.

While the present invention has been shown and described with reference to certain preferred embodiments, it is to be understood that those skilled in the art will no doubt devise certain alterations and modifications thereto which nevertheless include the true spirit and scope of the present invention. Thus the scope of the invention should be determined by the appended claims and their legal equivalents, rather than by examples given.

What is claimed is:

1. A memory cell comprising:
   a magnetic tunnel junction (MTJ) memory element including a magnetic free layer and a magnetic reference layer with an insulating tunnel junction layer interposed therebetween, said MTJ memory element having a low resistance state and a high resistance state that are switched in a bipolar manner; and
   a two-terminal selector conducting in two directions, said two-terminal selector having a first insulative state and a first conductive state in a first direction and a second insulative state and a second conductive state in a second direction opposite to said first direction, said first conductive state having substantially lower resistance than said second conductive state,
   wherein said two-terminal selector and said MTJ memory element are coupled in series in such a way that a switching current flowing in said second direction switches said MTJ memory element from said high resistance state to said low resistance state.

2. The memory cell of claim 1, wherein cell voltages required to respectively switch said MTJ memory element from said low to high resistance state and from said high to low resistance state are substantially same.

3. The memory cell of claim 1, wherein said magnetic free layer has a variable magnetization direction substantially perpendicular to a layer plane thereof, said magnetic reference layer has a first invariable magnetization direction substantially perpendicular to a layer plane thereof.

4. The memory cell of claim 3, wherein said MTJ memory element further includes a magnetic fixed layer exchanged coupled to said magnetic reference layer through an anti-ferromagnetic coupling layer, said magnetic fixed layer having a second invariable magnetization direction that is substantially perpendicular to a layer plane thereof and is opposite to said first invariable magnetization direction.

5. The memory cell of claim 4, wherein a switching voltage of said MTJ memory element from said low resistance state to said high resistance state is substantially same as a switching voltage of said MTJ memory element from said high resistance state to said low resistance state.

6. The memory cell of claim 4, wherein stray magnetic fields exerted on said magnetic free layer by said magnetic reference layer and said magnetic fixed layer, respectively, substantially cancel each other.

7. The memory cell of claim 3, wherein said MTJ memory element further includes a magnetic compensation layer separated from said magnetic free layer by a non-magnetic spacer layer, said magnetic compensation layer having a second invariable magnetization direction that is substantially perpendicular to a layer plane thereof and is opposite to said first invariable magnetization direction.

8. The memory cell of claim 7, wherein a switching voltage of said MTJ memory element from said low resistance state to said high resistance state is substantially same as a switching voltage of said MTJ memory element from said high resistance state to said low resistance state.

9. The memory cell of claim 7, wherein stray magnetic fields exerted on said magnetic free layer by said magnetic reference layer and said magnetic compensation layer, respectively, substantially cancel each other.

10. The memory cell of claim 1, wherein said two-terminal selector includes a first electrode and a second electrode with a switching layer interposed therebetween, said switching layer being insulative in absence of an applied voltage to said first or second electrode.

11. The memory cell of claim 10, wherein said first and second electrodes are made of different materials.

12. A memory cell comprising:
   a magnetic tunnel junction (MTJ) memory element that switches in a bipolar manner including:
      a magnetic free layer having a variable magnetization direction substantially perpendicular to a layer plane thereof;
      a magnetic reference layer having a first invariable magnetization direction substantially perpendicular to a layer plane thereof;
      an insulating tunnel junction layer interposed between said magnetic free layer and said magnetic reference layer;
      an anti-ferromagnetic coupling layer formed adjacent to said magnetic reference layer opposite said insulating tunnel junction layer; and
      a magnetic fixed layer formed adjacent to said anti-ferromagnetic coupling layer opposite said magnetic reference layer, said magnetic fixed layer having a second invariable magnetization direction that is substantially perpendicular to a layer plane thereof and is opposite to said first invariable magnetization direction; and
   a selector structure conducting in two directions and including a first electrode and a second electrode with a switching layer interposed therebetween, said selector structure having a first insulative state and a first conductive state in a first direction and a second insulative state and a second conductive state in a second direction opposite to said first direction, said first conductive state having substantially lower resistance than said second conductive state,
   wherein said selector structure and said MTJ memory element are coupled in series in such a way that a parallelizing switching current flows in said second direction.

13. The memory cell of claim 12, wherein said second electrode is formed adjacent to said magnetic fixed layer.

14. The memory cell of claim 13, wherein an interface layer is formed between said second electrode and said magnetic fixed layer.

15. The memory cell of claim 12, wherein said first electrode is formed adjacent to said magnetic free layer.

16. The memory cell of claim 15, wherein an interface layer is formed between said first electrode and said magnetic free layer.

17. The memory cell of claim 12, said magnetic free layer includes two or more magnetic sublayers.

18. The memory cell of claim 12, wherein stray magnetic fields exerted on said magnetic free layer by said magnetic reference layer and said magnetic fixed layer, respectively, substantially cancel each other.

19. The memory cell of claim 12, wherein a cell voltage required to switch said MTJ memory element from a low resistance state to a high resistance state is substantially same as a cell voltage required to switch said MTJ memory element from said high resistance state to said low resistance state.

20. The memory cell of claim 12, wherein said first and second electrodes are made of different materials.

21. A memory cell comprising:
a magnetic tunnel junction (MTJ) memory element including:
  a magnetic free layer having a variable magnetization direction substantially perpendicular to a layer plane thereof;
  a magnetic reference layer having a first invariable magnetization direction substantially perpendicular to a layer plane thereof;
  an insulating tunnel junction layer interposed between said magnetic free layer and said magnetic reference layer;
  an anti-ferromagnetic coupling layer formed adjacent to said magnetic reference layer opposite said insulating tunnel junction layer; and
  a magnetic fixed layer formed adjacent to anti-ferromagnetic coupling layer opposite said magnetic reference layer, said magnetic fixed layer having a second invariable magnetization direction that is substantially perpendicular to a layer plane thereof and is opposite to said first invariable magnetization direction; and
a selector structure coupled to said MTJ memory element in series, said selector structure including a first electrode and a second electrode with a switching layer interposed therebetween,
wherein said selector structure has substantially lower resistance when switching a relative orientation between said variable magnetization direction and said first invariable magnetization direction from parallel to anti-parallel than from anti-parallel to parallel,
wherein said switching layer is insulative in absence of an applied voltage to said first or second electrode, said switching layer including a plurality of conductive clusters imbedded in a nominally insulative matrix, a concentration of said plurality of conductive clusters in said nominally insulative matrix decreases along a direction of an anti-parallelizing current.

* * * * *